(12) United States Patent
Li et al.

(10) Patent No.: US 7,972,888 B1
(45) Date of Patent: Jul. 5, 2011

(54) METHODS FOR MANUFACTURING MEMS SENSOR AND THIN FILM AND CANTILEVER BEAM THEREOF WITH EPITAXIAL GROWTH PROCESS

(75) Inventors: Gang Li, Suzhou (CN); Wei Hu, Suzhou (CN)

(73) Assignee: Memsensing Microsystems Technology Co., Ltd., Suzhou, Jiangsu Province (CN)

( * ) Notice: Subject to any disclaimer, the term of this patent is extended or adjusted under 35 U.S.C. 154(b) by 0 days.

(21) Appl. No.: 12/813,503

(22) Filed: Jun. 10, 2010

(30) Foreign Application Priority Data

Mar. 11, 2010 (CN) .......................... 2010 1 0131597

(51) Int. Cl.
*H01L 21/00* (2006.01)

(52) U.S. Cl. ...................... 438/52; 438/50; 257/E21.001

(58) Field of Classification Search .................... 438/50, 438/52

See application file for complete search history.

(56) References Cited

U.S. PATENT DOCUMENTS 7,242,089 B2   7/2007 Minervini
7,630,589 B2   12/2009 Kilic et al.

*Primary Examiner* — Alexander G Ghyka
(74) *Attorney, Agent, or Firm* — Cheng-Ju Chiang (57) ABSTRACT

A method for manufacturing a MEMS sensor and its thin film and cantilever beam includes steps of etching a top surface of a single-crystal silicon wafer in combination of a deposition process, an outer epitaxial growth process, a wet etching process and a back etching process in order to form a pressure-sensitive single-crystal silicon film, a cantilever beam, a mass block, a front chamber, a back chamber and trenches connecting the front and the back chambers. The single-crystal silicon film is prevented from etching so that the thickness thereof can be well controlled. The method of the present invention can be used to replace the traditional method which forms the back chamber and the pressure-sensitive single-crystal silicon film from the bottom surface of the silicon wafer.

20 Claims, 9 Drawing Sheets

METHODS FOR MANUFACTURING MEMS SENSOR AND THIN FILM AND CANTILEVER BEAM THEREOF WITH EPITAXIAL GROWTH PROCESS

BACKGROUND OF THE INVENTION

1. Field of the Invention

The present invention relates to a method for manufacturing a MEMS sensor and methods for fabricating a thin film and a cantilever beam of such MEMS sensor with epitaxial growth processes.

2. Description of Related Art

Micro-Electro-Mechanical Systems (MEMS) is a high technology rapidly developed in recent years. MEMS components can be manufactured by advanced semiconductor manufacturing processes to realize mass production. Compared with the traditional electronic components, the MEMS components are more competitive in profile, power consumption, weight and price etc.

Usually, a MEMS condenser includes micro structures such as a thin film, a mass block and a cantilever beam etc. The traditional method for manufacturing such thin film uses surface sacrificial processes which include steps of: (i) fabricating a sacrificial layer by a Low Pressure Chemical Vapor Deposition (LPCVD) process or a Plasma Enhanced Chemical Vapor Deposition (PEVCD) process or a Physical Vapor Deposition (PVD) process; (ii) fabricating a thin film on the sacrificial layer by the fore deposition methods; and (iii) etching the sacrificial layer under the thin film to release the thin film to be movable micro structures. Such method can be used to fabricate a polysilicon thin film, a metal thin film or a medium thin film etc. However, such method is not suitable to fabricate a single-crystal silicon film.

Pressure sensors are those MEMS sensors earliest appear to be used. The pressure sensors are divided into a piezoresistive type, a capacitive type and a piezoelectric type etc. The piezoresistive pressure sensor has advantages of mass output signals, simple follow-up processing and easy for mass production. However, the piezoresistive pressure sensors are usually fabricated on the single-crystal pressure-sensitive silicon film. In mass production, it is a key guideline to keep the uniformity thickness of the pressure-sensitive silicon films of the piezoresistive pressure sensors. The current method for fabricating the pressure-sensitive silicon film is to anisotropically etch the single-crystal silicon wafer from its bottom side via a kind of alkaline liquor. As a result, a back chamber is formed at the bottom side of the single-crystal silicon wafer, and meanwhile, the pressure-sensitive silicon film is formed at the top side of the single-crystal silicon wafer. In order to control the thickness of the pressure-sensitive silicon film, a time controlling method is selected. However, such method cannot uniform the thickness of the inside and outside pressure-sensitive silicon films. Another method is to use the highly doped silicon film to control the thickness of the pressure-sensitive silicon film. However, since the piezoresistances cannot be fabricated on the highly doped silicon film, such method is not suitable to manufacture the pressure-sensitive silicon films of the piezoresistive pressure sensors. Another method is to use electrochemical etching to achieve the lowly doped silicon film which can be used to fabricate piezoresistances. However, such method needs additional apparatus, such as expensive potentiostats and clip tools for protecting the silicon wafer. The cost is accordingly enhanced and the manufacture efficiency is decreased due to additional processes.

Acceleration sensors are another kinds of MEMS sensors and are divided into a piezoresistive type, a capacitive type and a piezoelectric type etc. The piezoresistive type acceleration sensor needs to fabricate piezoresistances on its cantilever beam in order to detect the acceleration. Usually, the cantilever beam is fabricated from a single-crystal silicon film, which still meets the problems described in the above piezoresistive pressure sensors.

Hence, it is desired to have improved methods for manufacturing a MEMS sensor and its thin film and cantilever beam solving the problems above.

BRIEF SUMMARY OF THE INVENTION

The present invention discloses a method for manufacturing a MEMS sensor comprising steps of:

a) etching a top surface of a single-crystal silicon wafer to form a deep hole;

b) depositing a medium layer on the top surface of the single-crystal silicon wafer under an arrangement that the medium layer fills in the deep hole to form a sacrificial layer;

c) partly etching the single-crystal silicon wafer through the medium layer to form a chamber and a plurality of remainder single-crystal silicon chips under the medium layer, the single-crystal silicon wafer being etched to terminate at the sacrificial layer which is located adjacent to the chamber, the remainder single-crystal silicon chips forming a meshwork silicon film and each remainder single-crystal silicon chip having an inverted triangle shaped cross section;

d) removing the medium layer from the single-crystal silicon wafer in order to expose the meshwork silicon film via Buffered Oxide Etchant (BOE), while leaving the sacrificial layer;

e) expanding a single-crystal silicon film based on the meshwork silicon film via an epitaxial growth process, the single-crystal silicon film covering the meshwork silicon film, and then fabricating a piezoresistance on the single-crystal silicon film;

f) fabricating a passivation layer covering the single-crystal silicon film;

g) etching the passivation layer to form a through hole corresponding to the piezoresistance;

h) fabricating a metal pad on the passivation layer and a metal trace filling in the through hole, via a metal deposition process or a photo etching process or a metal etching process, the metal trace connecting the metal pad and the piezoresistance;

i) forming a back cavity from a bottom surface of the single-crystal silicon wafer under a condition that the back cavity and the chamber are separated from each other by the sacrificial layer; and j) finally, removing the sacrificial layer by a wet etching process so as to communicating the back cavity with the chamber. The single-crystal silicon film cannot be etched in the following etching processes as a result that the thickness thereof can be well controlled.

A method for manufacturing a thin film of a MEMS sensor comprises steps of:

a) forming a medium layer on a top surface of a single-crystal silicon wafer via a deposition process, the medium layer functioning as a mask layer;

b) partly removing the medium layer in order to form a mask diagram;

c) etching the single-crystal silicon wafer from the mask diagram via a Deep Reactive Ion Etching (DRIE) process to form a plurality of trenches extending into an inner side of the single-crystal silicon wafer;

d) partly etching the single-crystal silicon wafer through the mask diagram via a DRIE process and/or an anisotropic etching process to form a inner chamber and a plurality of remainder single-crystal silicon chips under the medium layer, the trenches being in communication with the inner chamber, the remainder single-crystal silicon chips forming a meshwork silicon film and each remainder single-crystal silicon chip having an inverted triangle shaped cross section;

e) removing the medium layer from the single-crystal silicon wafer in order to expose the meshwork silicon film, via a dry etching process or a wet etching process; and f) finally, expanding a single-crystal silicon film based on the meshwork silicon film via an epitaxial growth process, the single-crystal silicon film covering the meshwork silicon film to shield the trenches, the inner chamber being located under the single-crystal silicon film.

A method for manufacturing a cantilever beam of a MEMS sensor comprises steps of:

a) etching a top surface of a single-crystal silicon wafer to form a deep hole extending into an inner side of the single-crystal silicon wafer;

b) depositing a medium layer on the top surface of the single-crystal silicon wafer via a deposition process, under an arrangement that the medium layer fills in the deep hole to form a sacrificial layer, the medium layer functioning as a mask layer;

c) forming a mask diagram on the medium layer;

d) etching the single-crystal silicon wafer through the mask diagram via a Deep Reactive Ion Etching (DRIE) process to form a plurality of trenches;

e) partly etching the single-crystal silicon wafer through the mask diagram via a DRIE process and/or an anisotropic etching process to form an inner chamber and a plurality of remainder single-crystal silicon chips under the medium layer, the chamber being in communication with the trenches and being located at an inner side of the sacrificial layer, the remainder single-crystal silicon chips forming a girder-shaped silicon film, each remainder single-crystal silicon chip having an inverted triangle shaped cross section, the single-crystal silicon wafer being etched to terminate at the sacrificial layer;

f) removing the medium layer from the single-crystal silicon wafer in order to expose the girder-shaped silicon film, via a dry etching process or a wet etching process;

g) expanding a single-crystal silicon film based on the girder-shaped silicon film via an epitaxial growth process, the single-crystal silicon film covering the girder-shaped silicon film to shield the trenches, the inner chamber being located under the single-crystal silicon film;

h) fabricating a diagram of a cantilever beam on the single-crystal silicon film;

i) forming a back cavity from a bottom surface of the single-crystal silicon wafer via a photo etching process or a DRIE process, the back cavity and the inner chamber being separated from each other by the sacrificial layer; and j) finally, removing the sacrificial layer via a wet etching process to connecting the back cavity and the inner chamber, and ultimately releasing the cantilever beam.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

FIGS. 28-39 are schematic views showing steps for manufacturing a MEMS sensor according to a fourth embodiment of the present invention, wherein

DETAILED DESCRIPTION OF THE PREFERRED EMBODIMENTS

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Please refer to FIGS. 1-7, a method for fabricating a thin film of a MEMS sensor according to a first embodiment of the present invention is disclosed and includes the following steps.

Figure 1:
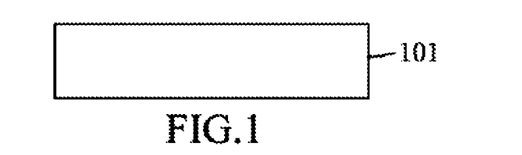
FIGS. 1-7 are schematic views showing steps for manufacturing a thin film of a MEMS sensor according to a first embodiment of the present invention.
Figure 2:
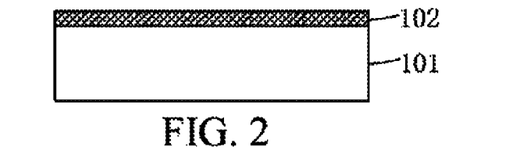

Please refer to FIGS. 1 and 2, firstly, a medium layer 102 is formed on a top surface of a single-crystal silicon wafer 101 via a deposition process, such as a Low Pressure Chemical Vapor Deposition (LPCVD) process or a Plasma Enhanced Chemical Vapor Deposition (PEVCD) process or a thermal oxidation process. The medium layer 102 is made of silicon oxide or silicon nitride to function as a mask layer in the following etching processes.

Figure 3:
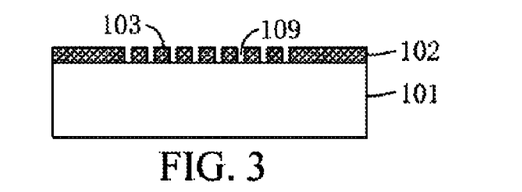

Secondly, referring to FIG. 3, the medium layer 102 is partly removed via an etching process, such as a photo etching process or a dry etching process or a wet etching process, in order to form a meshwork mask diagram 103.

Figure 4:
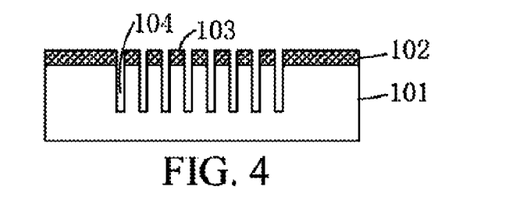
Figure 8:
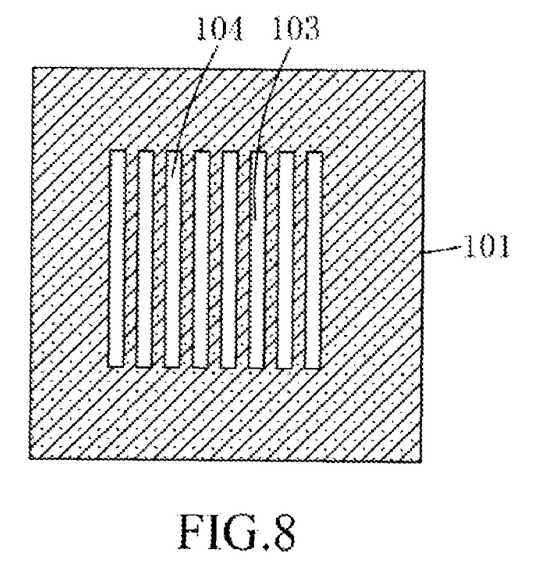
FIG. 8 is a schematic cross-sectional view of trenches and a mask diagram of the thin film.
Figure 9:
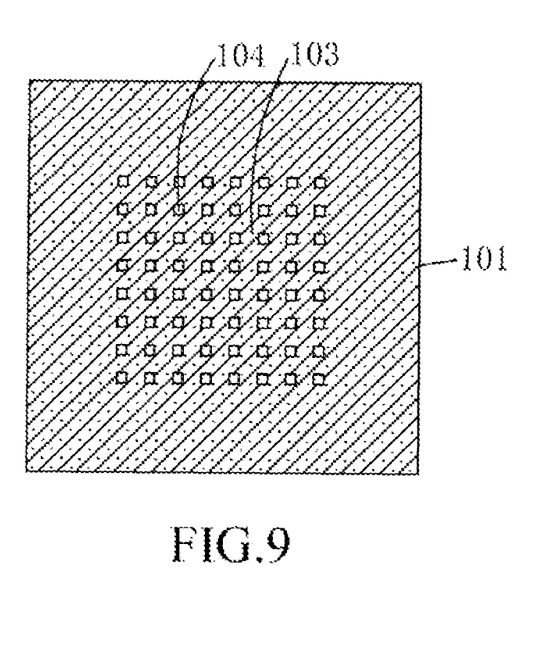
FIG. 9 is another schematic cross-sectional view of the trenches and the mask diagram shown in FIG. 8, alternatively.

Thirdly, referring to FIG. 4, a plurality of trenches 104 are formed by etching the single-crystal silicon wafer 101 through the mask diagram 103 via a Deep Reactive Ion Etching (DRIE) process. The trenches 104 further extend into an inner side of the single-crystal silicon wafer 101. As shown in FIGS. 8 and 9, the shapes of the trenches 104 can be square or rectangular or round. The dimensions of the trenches 104 are determined by the actual design.

Figure 5:
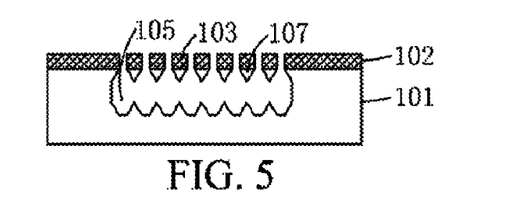

Fourthly, referring to FIG. 5, the single-crystal silicon wafer 101 is then partly etched through the mask diagram 103 via a DRIE process and/or an anisotropic etching process to form an inner chamber 105 and a plurality of remainder single-crystal silicon chips 107 located under the medium layer 102. The anisotropic etching process includes infusing KOH or tetramethyl ammonium hydroxide (TMAH) into the trenches 104 so as to etch the single-crystal silicon wafer 101. The trenches 104 are in communication with the inner chamber 105. The remainder single-crystal silicon chips 107 forms a meshwork silicon film. Each remainder single-crystal silicon chip 107 has an inverted triangle shaped cross section.

Figure 6:
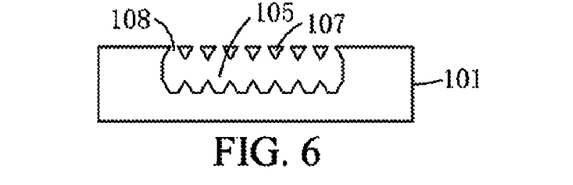

Fifthly, referring to FIG. 6, the medium layer 102 is then removed from the single-crystal silicon wafer 101 in order to expose the meshwork silicon film, via a dry etching process such as a reactive ion etching process, or a wet etching process such as using the Buffered Oxide Etchant (BOE). Thereafter, a plurality of small holes 108 are formed at the top surface of the single-crystal silicon wafer 101. The small holes 108 and the trenches 104 have the same transverse dimensions.

Figure 7:
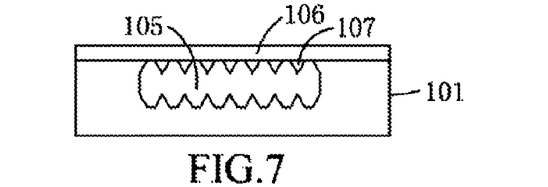

Finally, referring to FIG. 7, an integrate single-crystal silicon film 106 is then expanded based on the meshwork silicon film via an epitaxial growth process. The single-crystal silicon film 106 fills in the small holes 108 because the epitaxial growth process is isotropic. Since the small holes 108 are small in size, the reactive gas cannot easily enter the inner chamber 105. As a result, the single-crystal silicon film 106 covers the meshwork silicon film and shields the trenches 104. The thickness of the independent single-crystal silicon film 106 is easy to control because the single-crystal silicon film 106 lastly grows. The inner chamber 105 is located under the single-crystal silicon film 106. The single-crystal silicon film 106 can be used as a pressure-sensitive film of a pressure sensor or a diaphragm of other components.

Besides, the single-crystal silicon film 106 cannot be etched in the following etching processes as a result that the thickness of the single-crystal silicon film 106 can be well controlled. The traditional etching process with the silicon wafer etched from its bottom surface can't prevent the diaphragm from further being etched. As a result, the thickness of the diaphragm can't be well controlled. However, the current fabrication method of the first embodiment of the present invention can overcome such difficulty of the traditional method. Besides, the current fabrication method is simple and useful because no additional apparatus, such as the expensive potentiostats or clip tools for protecting the silicon wafer, is needed.

Please refer to FIGS. 10-16, a method for fabricating a mass block of a MEMS sensor according to a second embodiment of the present invention is disclosed and includes the following steps.

Figure 10:
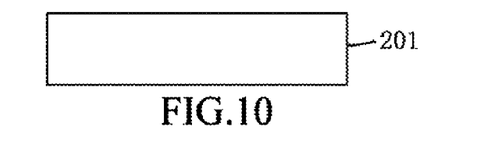
FIGS. 10-15 are schematic views showing steps for manufacturing a mass block of a MEMS sensor according to a second embodiment of the present invention.
Figure 11:
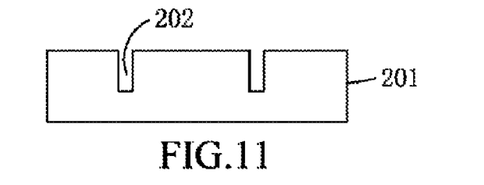

Please refer to FIGS. 10 and 11, firstly, a top surface of a single-crystal silicon wafer 201 is etched via an etching process, such as a photo etching process or a dry etching process or a wet etching process, in order to form a deep hole 202. The deep hole 202 further extends into an inner side of the single-crystal silicon wafer 201.

Figure 12:
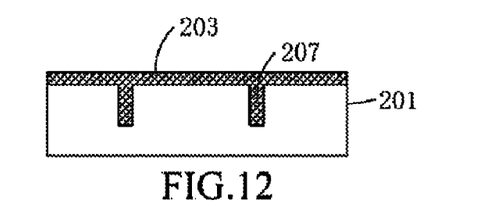

Secondly, referring to FIG. 12, a medium layer 203 is then formed on the top surface of the single-crystal silicon wafer 201 via a deposition process, such as a Low Pressure Chemical Vapor Deposition (LPCVD) process or a Plasma Enhanced Chemical Vapor Deposition (PEVCD) process or a thermal oxidation process. The medium layer 203 is made of silicon oxide or silicon nitride and fills in the deep hole 202 to form a sacrificial layer 207.

Figure 13:
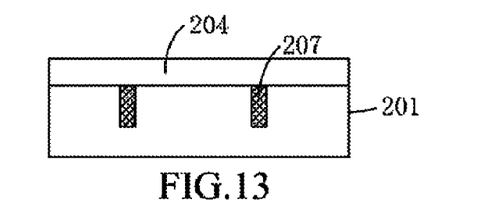

Thirdly, referring to FIG. 13, the medium layer 203 is removed by Buffered Oxide Etchant (BOE). However, the sacrificial layer 207 is not etched by the prior etching process and still exists because of the protection characteristics of such etching process. Then, an integrate single-crystal silicon film 204 is expanded via an epitaxial growth process to cover the top surface of the single-crystal silicon wafer 201.

Figure 14:
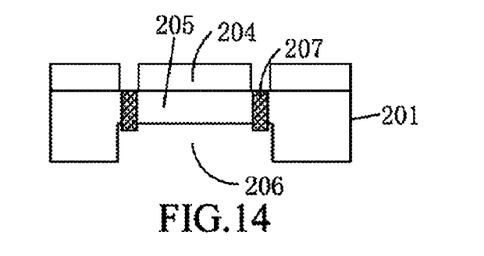

Fourthly, referring to FIG. 14, the single-crystal silicon film 204 is then etched to form a diagram of a mass block 205.

Figure 15:
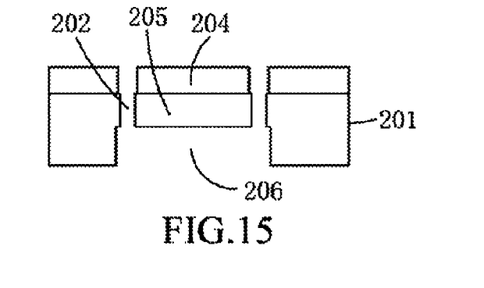

Fifthly, referring to FIG. 15, a back cavity 206 is then formed by etching a bottom surface of the single-crystal silicon wafer 201. The mass block 205 and the corresponding single-crystal silicon wafer 201 are separated from each other by the sacrificial layer 207.

Figure 16:
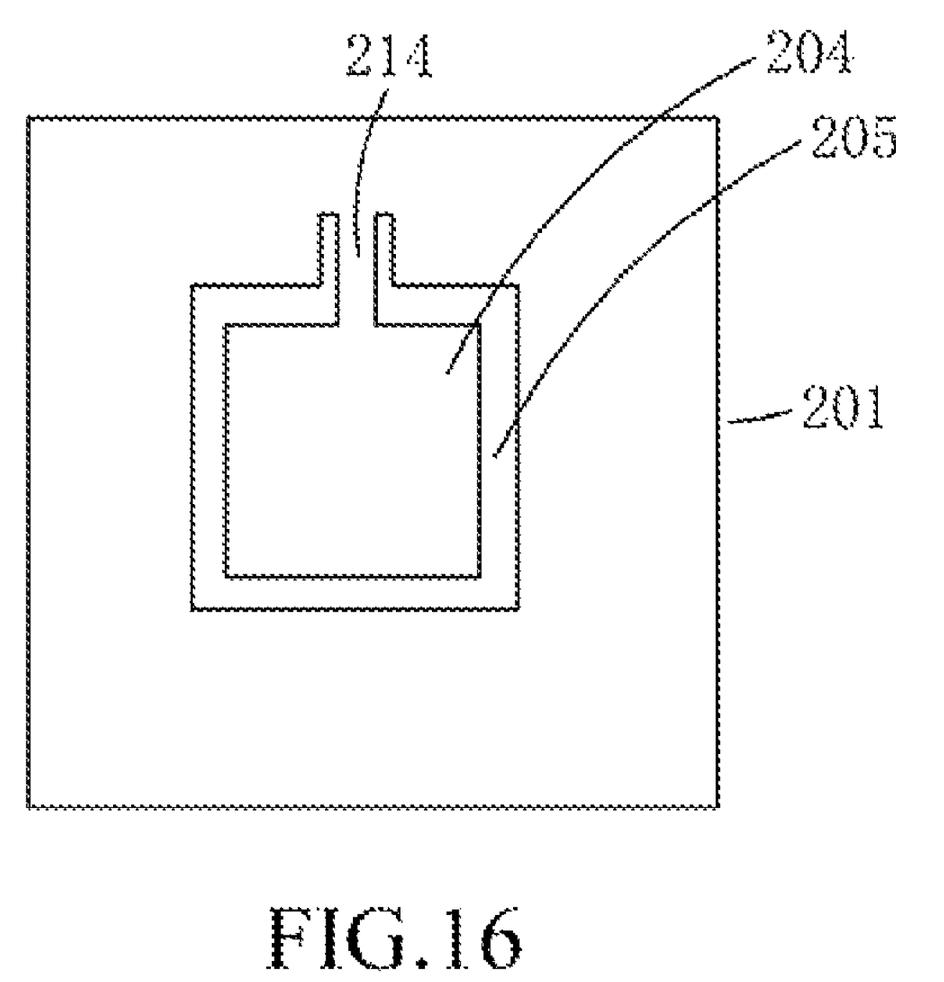
FIG. 16 is a top view of the mass block shown in FIG. 15.

Finally, referring to FIG. 16, the sacrificial layer 207 is then removed via a reactive ion etching process or a wet etching process in order to communicating the mass block 205 with the corresponding single-crystal silicon wafer 201. As a result, the mass block 205 is released to be a movable structure.

According to the second embodiment of the present invention, the single-crystal silicon film 204 cannot be etched in the following etching processes as a result that the thickness of the single-crystal silicon film 204 can be well controlled.

Please refer to FIGS. 17-27, a method for fabricating a cantilever beam of a MEMS sensor according to a third embodiment of the present invention is disclosed and includes the following steps.

Figure 17:
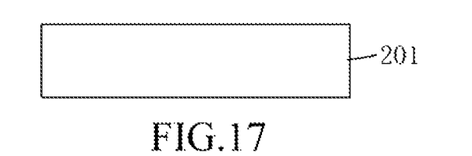
FIGS. 17-27 are schematic views showing steps for manufacturing a cantilever beam of a MEMS sensor according to a third embodiment of the present invention.
Figure 18:
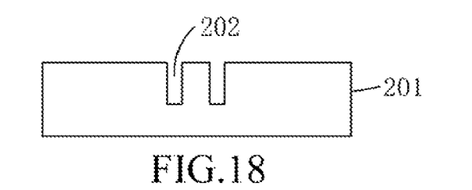

Please refer to FIGS. 17 and 18, firstly, a top surface of a single-crystal silicon wafer 201 is etched via an etching process, such as a photo etching process or a dry etching process or a wet etching process, in order to form a deep hole 202. The deep hole 202 further extends into an inner side of the single-crystal silicon wafer 201.

Figure 19:
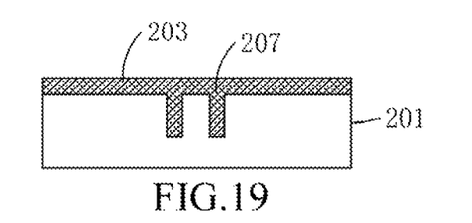

Secondly, referring to FIG. 19, a medium layer 203 is then formed on the top surface of the single-crystal silicon wafer 201 via a deposition process, such as a Low Pressure Chemical Vapor Deposition (LPCVD) process or a Plasma Enhanced Chemical Vapor Deposition (PEVCD) process or a thermal oxidation process. The medium layer 203 is made of silicon oxide or silicon nitride and fills in the deep hole 202 to form a sacrificial layer 207. The medium layer 203 functions as a mask layer in the following etching processes.

Figure 20:
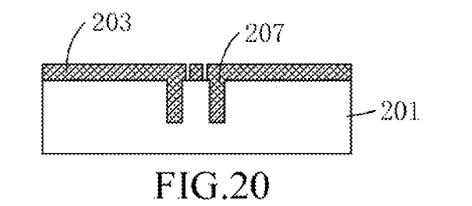

Thirdly, referring to FIG. 20, the medium layer 203 is partly removed by Buffered Oxide Etchant (BOE) to form a mask diagram on the medium layer 203. However, the sacrificial layer 207 is not etched by the prior etching process and still exists because of the protection characteristics of such etching process.

Figure 21:
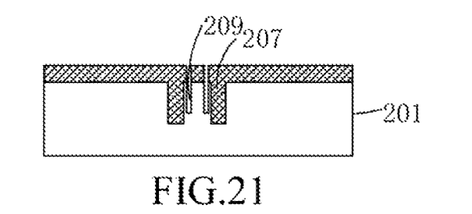

Fourthly, referring to FIG. 21, the single-crystal silicon wafer 201 is then etched through the mask diagram via a Deep Reactive Ion Etching (DRIE) process to form a plurality of trenches 209.

Figure 22:
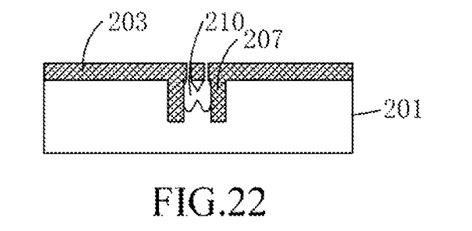

Fifthly, referring to FIG. 22, the single-crystal silicon wafer 201 is then partly etched through the mask diagram via a DRIE process and/or an anisotropic etching process to form an inner chamber 210 and a plurality of remainder single-crystal silicon chips 213 located under the medium layer 203. The anisotropic etching process includes infusing KOH or tetramethyl ammonium hydroxide (TMAH) into the trenches 209 so as to etch the single-crystal silicon wafer 201. The trenches 209 are in communication with the inner chamber 210. The remainder single-crystal silicon chips 213 form a girder-shaped silicon film. Each remainder single-crystal silicon chip 213 has an inverted triangle shaped cross section. The single-crystal silicon wafer 201 is etched to terminate at the sacrificial layer 207.

Figure 23:
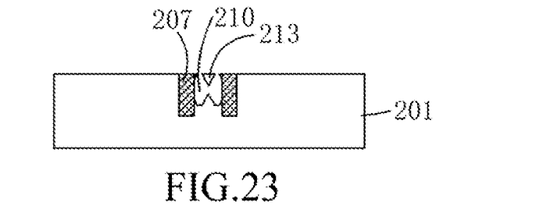

Sixthly, referring to FIG. 23, the medium layer 203 is then removed from the single-crystal silicon wafer 201 in order to expose the girder-shaped silicon film, via a dry etching process such as a reactive ion etching process, or a wet etching process such as using the Buffered Oxide Etchant (BOE).

Figure 24:
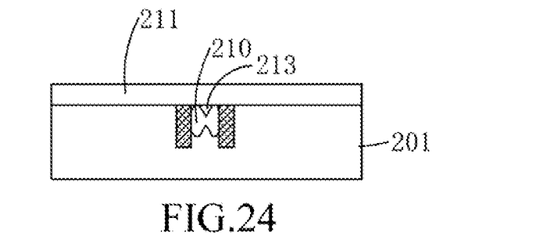

Seventhly, referring to FIG. 24, a single-crystal silicon film 211 is then expanded based on the girder-shaped silicon film via an epitaxial growth process. The thickness of the independent single-crystal silicon film 211 is easy to control. The single-crystal silicon film 211 is integrated because the epitaxial growth process is isotropic. As a result, the single-crystal silicon film 211 covers the girder-shaped silicon film and shields the trenches 209. The inner chamber 210 is located under the single-crystal silicon film 211. The single-crystal silicon film 211 can be used as a pressure-sensitive film of a pressure sensor or a diaphragm of other components.

Figure 25:
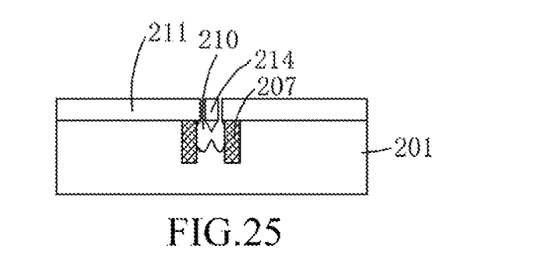

Eighthly, as shown in FIG. 25, a diagram of at least one cantilever beam 214 is then fabricated on the single-crystal silicon film 211. However, the amount of the diagram can be single or multiple so that the amount of the cantilever beam 214 can be single or multiple, accordingly.

Figure 26:
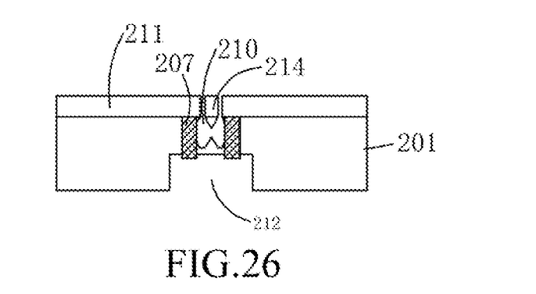

Ninthly, referring to FIG. 26, a back cavity 212 is then formed from a bottom surface of the single-crystal silicon wafer 201 via a photo etching process or a DRIE process. The back cavity 212 and the inner chamber 210 are not communicated with each other and are separated from each other by the sacrificial layer 207. Under this condition, the thickness of the cantilever beam 214 cannot be influenced by the etching processes so that the thickness can be well controlled.

Figure 27:
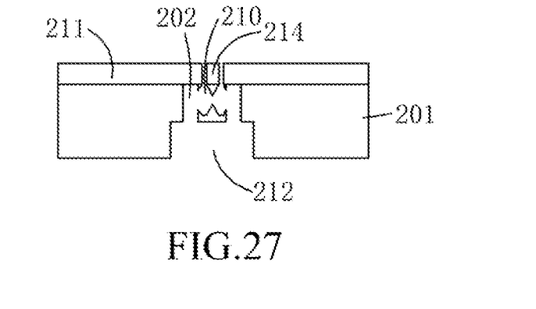

Finally, referring to FIG. 27, the sacrificial layer 207 is then removed via a reactive ion etching process or a wet etching process in order to communicate the back cavity 212 with the inner chamber 210. As a result, the cantilever beam 214 is released to be a movable structure.

The single-crystal silicon film 211 cannot be etched in the following etching processes as a result that the thickness of the single-crystal silicon film 211 can be well controlled. In the traditional etching process, the diaphragm will further be etched when the silicon wafer is etched from its bottom surface. As a result, the thickness of the diaphragm can't be well controlled. However, the current fabrication method of the third embodiment of the present invention can overcome such difficulty of the traditional method. Besides, the current fabrication method is simple and useful because no additional apparatus, such as the expensive potentiostats or clip tools for protecting the silicon wafer, is needed.

Please refer to FIGS. 28-40, a method for fabricating a MEMS sensor, such as a piezoresistive pressure sensor and/or an acceleration sensor, according to a fourth embodiment of the present invention is disclosed based upon the combination of the above methods of the first, the second and the third embodiments, and some additional processes of piezoresistance fabrication and metal trace fabrication. The piezoresistive pressure sensor and the acceleration sensor can be independently fabricated by different silicon wafers or can be jointly fabricated by a single silicon wafer. Hereinafter, take the single silicon wafer adapted for making both the piezoresistive pressure sensor and the acceleration sensor for example, and such method includes the following steps.

Figure 28:
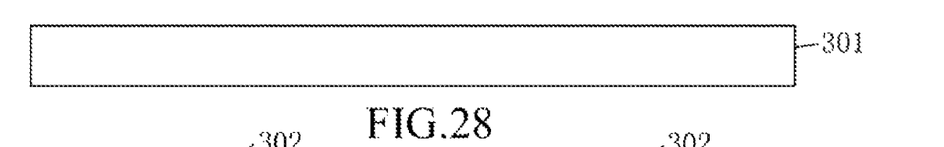
Figures 29, 30, 31:
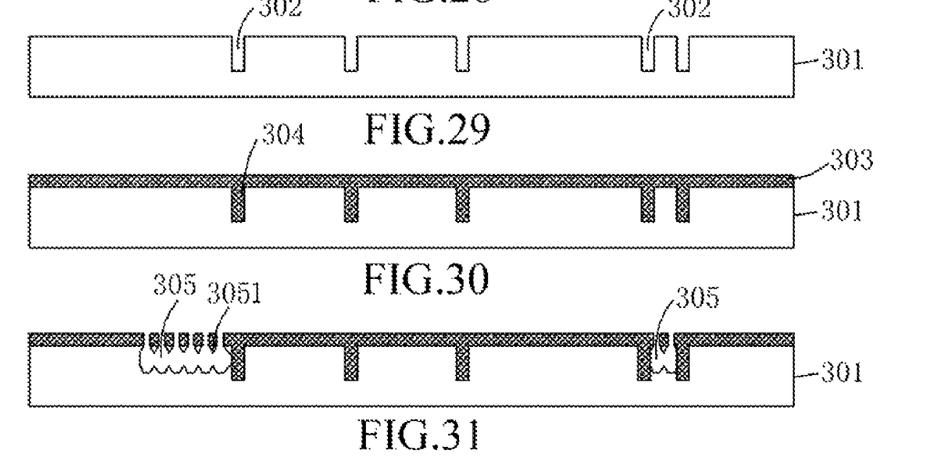

Please refer to FIGS. 28 and 29, firstly, a plurality of deep holes 302 are formed by etching a top surface of a single-crystal silicon wafer 301. The deep holes 302 can be used to communicate with a chamber in order to fabricate the piezoresistive pressure sensor, or can be used to release a mass block and a cantilever beam in order to fabricate the acceleration sensor.

Secondly, as shown in FIG. 30, a medium layer 303 is then formed on the top surface of the single-crystal silicon wafer 301 via a deposition process, such as a Low Pressure Chemical Vapor Deposition (LPCVD) process or a Plasma Enhanced Chemical Vapor Deposition (PEVCD) process or a thermal oxidation process. The medium layer 303 is made of silicon oxide or silicon nitride and fills in the deep hole 302 to form a sacrificial layer 304. The medium layer 303 functions as a mask layer in the following etching processes.

Thirdly, referring to FIG. 31, the single-crystal silicon wafer 301 is partly etched from trenches defined through the medium layer 303 to form a chamber 305 and a plurality of remainder single-crystal silicon chips 3051 under the medium layer 303, by using the same methods disclosed in the second and the third embodiments. The remainder single-crystal silicon chips 3051 form a meshwork silicon film and each remainder single-crystal silicon chip 3051 has an inverted triangle shaped cross section. The single-crystal silicon wafer 301 is etched to terminate at the sacrificial layer 304.

Figure 32:
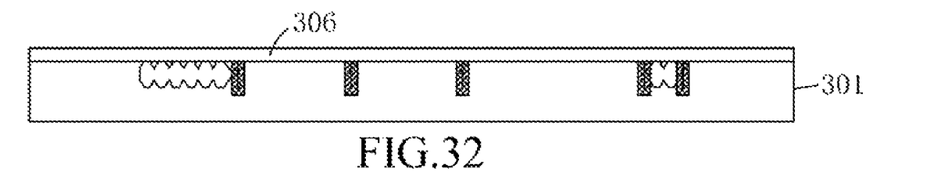

Fourthly, referring to FIG. 32, the medium layer 303 is removed by Buffered Oxide Etchant (BOE) to expose the meshwork silicon film. However, the sacrificial layer 304 is not etched by such etching process and still exists because of the protection characteristics of such etching process. Then, a single-crystal silicon film 306 is expanded based on the meshwork silicon film via an epitaxial growth process so as to cover the meshwork silicon film.

Figure 33:
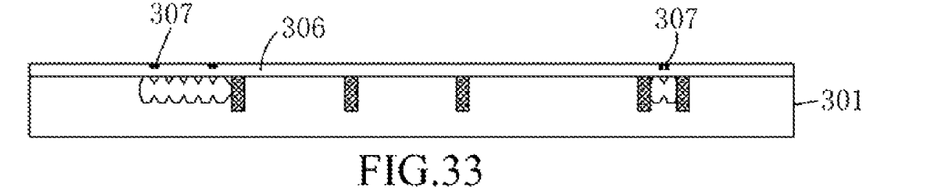

Fifthly, referring to FIG. 33, a plurality of piezoresistances 307 are fabricated on the single-crystal silicon film 306 via a photo etching process, an injection process and annealing process etc.

Figure 34:
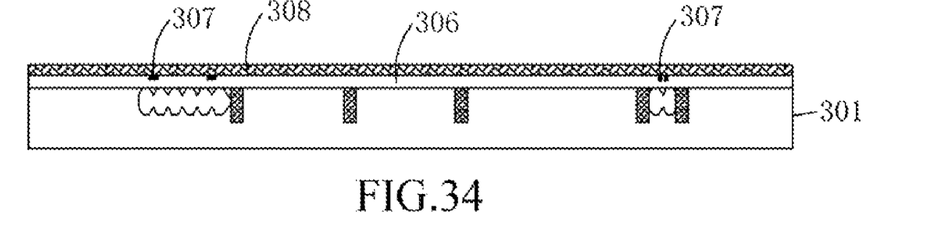

Sixthly, referring to FIG. 34, a passivation layer 308 is then fabricated on the single-crystal silicon film 306 and covering the single-crystal silicon film 306, via a LPCVD process or a PEVCD process. The passivation layer 308 can be made of silicon oxide or silicon nitride.

Figure 35:
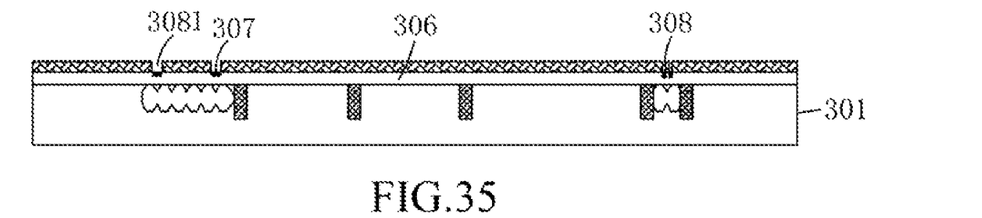

Seventhly, referring to FIG. 35, a plurality of through holes 3081 corresponding to and connecting the piezoresistances 307 are formed by etching the passivation layer 308.

Figure 36:
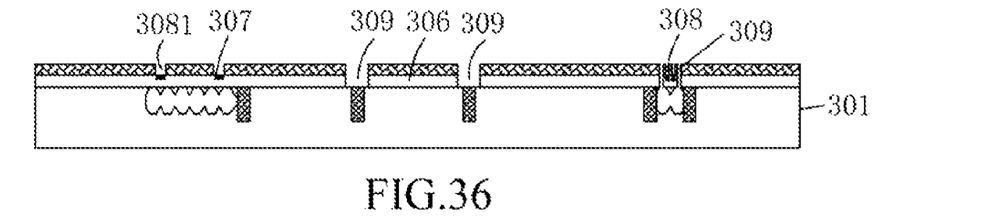

Eighthly, as shown in FIG. 36, a plurality of metal pads 312 and metal traces 310 are formed on the passivation layer 308, via a metal deposition process or a photo etching process or a metal etching process. The metal traces 310 fill in the through holes 3081, and connect the corresponding metal pads 312 and the piezoresistances 307 in order to extend the piezoresistances 307 beyond a top surface of the passivation layer 308. The passivation layer 308 is adapted for insulate the single-crystal silicon film 306 and the metal traces 310.

Figure 37:
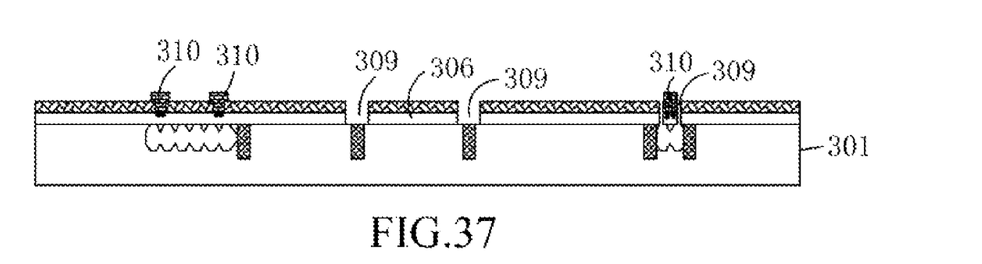

Ninthly, referring to FIG. 37, diagrams 309 of a cantilever beam and a mass block are then formed on the passivation layer 308.

Figure 38:
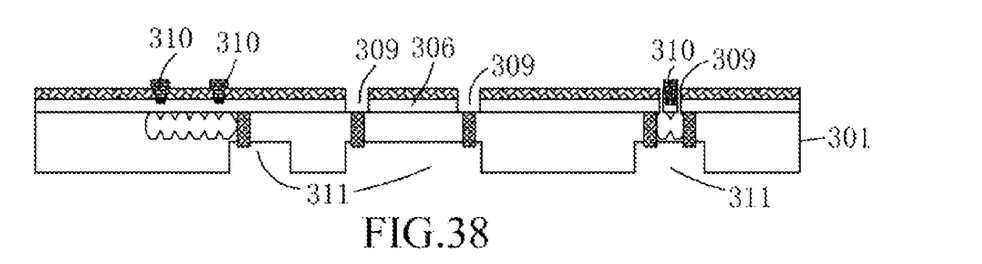

Tenthly, referring to FIG. 38, a back cavity 311 is then formed from a bottom surface of the single-crystal silicon wafer 301 via a photo etching process or a DRIE process. The back cavity 311 and the chamber 305 are not communicated with each other and are separated from each other by the sacrificial layer 304. Under this condition, the thickness of the single-crystal silicon film 306 cannot be influenced by the following etching processes so that the thickness thereof can be well controlled.

Figure 39:
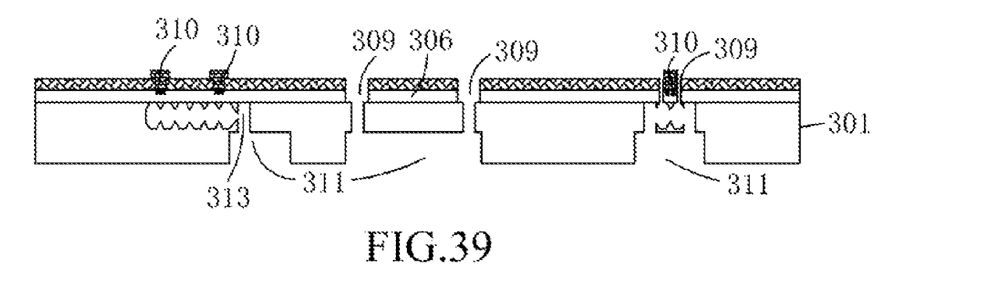
FIG. 39 is a cross-sectional view of the MEMS sensor taken along line 39-39 of FIG. 40.
Figure 40:
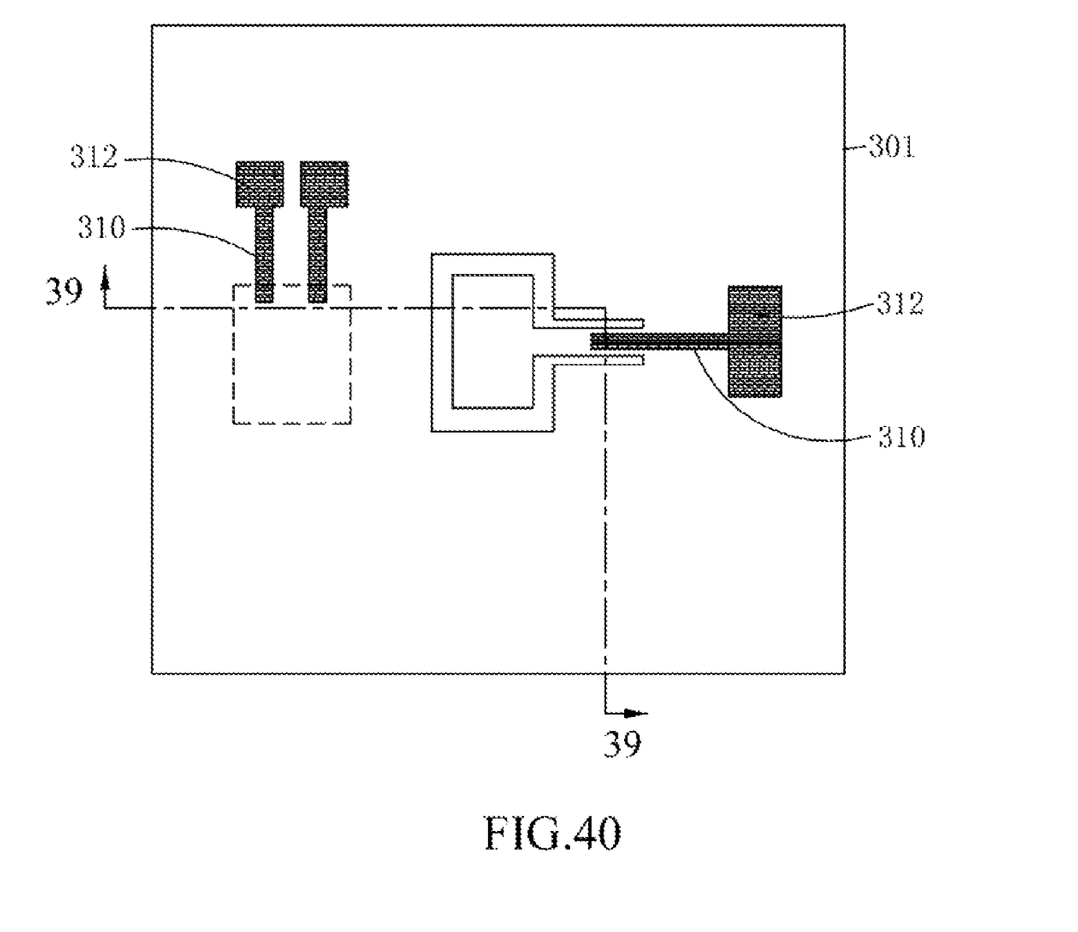
FIG. 40 is a top view of the MEMS sensor as shown in FIG. 39.

Finally, referring to FIG. 39, the sacrificial layer 304 is then removed via a reactive ion etching process or a wet etching process in order to communicate the back cavity 311 and the chamber 305. As a result, the cantilever beam and the mass block are both released to be movable structures to form the piezoresistive pressure sensor and the acceleration sensor, respectively. The part shown at the left side of the broken line is the piezoresistive pressure sensor, and the part shown at the right side of the broken line is the acceleration sensor. According to the fourth embodiment of the present invention, the piezoresistive pressure sensor and the acceleration sensor are commonly fabricated by a single single-crystal silicon wafer 301 to realize cost-effective manufacturing.

It is noted that the above ninthly step of the fourth embodiment is not needed when only the piezoresistive pressure sensors are fabricated. Under this condition, the single-crystal silicon film 306 will be driven to deform when the outer pressure is applied thereto. As a result, the piezoresistance of the single-crystal silicon film 306 is changed, which will result in a signal outputted by the metal traces 310. However, when the MEMS sensor is an acceleration sensor, the above ninthly step of the fourth embodiment is needed. Under this condition, the mass block will be driven to offset a distance when the outer acceleration is applied thereto. As a result, the cantilever beam deforms to output a changed signal transmitted by the metal traces 310.

It is to be understood, however, that even though numerous, characteristics and advantages of the present invention have been set forth in the foregoing description, together with details of the structure and function of the invention, the disclosed is illustrative only, and changes may be made in detail, especially in matters of number, shape, size, and arrangement of parts within the principles of the invention to the full extent indicated by the broad general meaning of the terms in which the appended claims are expressed.

What is claimed is:

1. A method for manufacturing a thin film of a MEMS sensor, comprising steps of:
   a) forming a medium layer on a top surface of a single-crystal silicon wafer via a deposition process, and the medium layer functioning as a mask layer;
   b) partly removing the medium layer in order to form a mask diagram;
   c) etching the single-crystal silicon wafer from the mask diagram via a Deep Reactive Ion Etching (DRIE) process to form a plurality of trenches extending into an inner side of the single-crystal silicon wafer;
   d) partly etching the single-crystal silicon wafer through the mask diagram via a DRIE process and/or an anisotropic etching process to form a inner chamber and a plurality of remainder single-crystal silicon chips under the medium layer, the trenches being in communication with the inner chamber, the remainder single-crystal silicon chips forming a meshwork silicon film and each remainder single-crystal silicon chip having an inverted triangle shaped cross section;
   e) removing the medium layer from the single-crystal silicon wafer in order to expose the meshwork silicon film, via a dry etching process or a wet etching process; and
   f) finally, expanding a single-crystal silicon film based on the meshwork silicon film via an epitaxial growth process, the single-crystal silicon film covering the meshwork silicon film to shield the trenches, the inner chamber being located under the single-crystal silicon film.

2. The method for manufacturing the thin film as claimed in claim 1, wherein the medium layer is made of silicon oxide or silicon nitride.

3. The method for manufacturing the thin film as claimed in claim 1, wherein the deposition process comprises a Low Pressure Chemical Vapor Deposition (LPCVD) process or a Plasma Enhanced Chemical Vapor Deposition (PEVCD) process or a thermal oxidation process.

4. The method for manufacturing the thin film as claimed in claim 1, wherein, in the step b), the mask diagram is formed by a photo etching process or a dry etching process or a wet etching process.

5. The method for manufacturing the thin film as claimed in claim 1, wherein, in the step d), the anisotropic etching process comprises infusing KOH or tetramethyl ammonium hydroxide (TMAH) into the trenches so as to etch the single-crystal silicon wafer.

6. The method for manufacturing the thin film as claimed in claim 1, wherein, in the step e), the medium layer is etched by Buffered Oxide Etchant (BOE).

7. The method for manufacturing the thin film as claimed in claim 1, wherein, in the step e), the medium layer is removed by a reactive ion etching process.

8. A method for manufacturing a cantilever beam of a MEMS sensor, comprising steps of:
   a) etching a top surface of a single-crystal silicon wafer to form a deep hole extending into an inner side of the single-crystal silicon wafer;
   b) depositing a medium layer on the top surface of the single-crystal silicon wafer via a deposition process, under an arrangement that the medium layer fills in the deep hole to form a sacrificial layer, the medium layer functioning as a mask layer;
   c) forming a mask diagram on the medium layer;
   d) etching the single-crystal silicon wafer through the mask diagram via a Deep Reactive Ion Etching (DRIE) process to form a plurality of trenches;
   e) partly etching the single-crystal silicon wafer through the mask diagram via a DRIE process and/or an anisotropic etching process to form an inner chamber and a plurality of remainder single-crystal silicon chips under the medium layer, the chamber being in communication with the trenches and being located at an inner side of the sacrificial layer, the remainder single-crystal silicon chips forming a girder-shaped silicon film, each remainder single-crystal silicon chip having an inverted triangle shaped cross section, the single-crystal silicon wafer being etched to terminate at the sacrificial layer;
   f) removing the medium layer from the single-crystal silicon wafer in order to expose the girder-shaped silicon film, via a dry etching process or a wet etching process;
   g) expanding a single-crystal silicon film based on the girder-shaped silicon film via an epitaxial growth process, the single-crystal silicon film covering the girder-shaped silicon film to shield the trenches, the inner chamber being located under the single-crystal silicon film;
   h) fabricating a diagram of a cantilever beam on the single-crystal silicon film;
   i) forming a back cavity from a bottom surface of the single-crystal silicon wafer via a photo etching process or a DRIE process, the back cavity and the inner chamber being separated from each other by the sacrificial layer; and
   j) finally, removing the sacrificial layer via a wet etching process to connecting the back cavity and the inner chamber, and ultimately releasing the cantilever beam.

9. The method for manufacturing the cantilever beam as claimed in claim 8, wherein the medium layer is made of silicon oxide or silicon nitride.

10. The method for manufacturing the cantilever beam as claimed in claim 8, wherein the deposition process comprises a Low Pressure Chemical Vapor Deposition (LPCVD) process or a Plasma Enhanced Chemical Vapor Deposition (PEVCD) process or a thermal oxidation process.

11. The method for manufacturing the cantilever beam as claimed in claim 8, wherein, in the step c), the mask diagram is formed by a photo etching process or a dry etching process or a wet etching process.

12. The method for manufacturing the cantilever beam as claimed in claim 8, wherein, in the step e), the anisotropic etching process comprises infusing KOH or tetramethyl ammonium hydroxide (TMAH) into the trenches so as to etch the single-crystal silicon wafer.

13. The method for manufacturing the cantilever beam as claimed in claim 8, wherein, in the step f), the medium layer is removed by Buffered Oxide Etchant (BOE) or a reactive ion etching process.

14. A method for manufacturing a MEMS sensor, comprising steps of:
 a) etching a top surface of a single-crystal silicon wafer to form a deep hole;
 b) depositing a medium layer on the top surface of the single-crystal silicon wafer under an arrangement that the medium layer fills in the deep hole to form a sacrificial layer;
 c) partly etching the single-crystal silicon wafer through the medium layer to form a chamber and a plurality of remainder single-crystal silicon chips under the medium layer, the single-crystal silicon wafer being etched to terminate at the sacrificial layer which is located adjacent to the chamber, the remainder single-crystal silicon chips forming a meshwork silicon film and each remainder single-crystal silicon chip having an inverted triangle shaped cross section;
 d) removing the medium layer from the single-crystal silicon wafer in order to expose the meshwork silicon film via Buffered Oxide Etchant (BOE), while leaving the sacrificial layer;
 e) expanding a single-crystal silicon film based on the meshwork silicon film via an epitaxial growth process, the single-crystal silicon film covering the meshwork silicon film, and then fabricating a piezoresistance on the single-crystal silicon film;
 f) fabricating a passivation layer covering the single-crystal silicon film;
 g) etching the passivation layer to form a through hole corresponding to the piezoresistance;
 h) fabricating a metal pad on the passivation layer and a metal trace filling in the through hole, via a metal deposition process or a photo etching process or a metal etching process, the metal trace connecting the metal pad and the piezoresistance;
 i) forming a back cavity from a bottom surface of the single-crystal silicon wafer under a condition that the back cavity and the chamber are separated from each other by the sacrificial layer; and
 j) finally, removing the sacrificial layer by a wet etching process so as to communicating the back cavity with the chamber.

15. The method for manufacturing the MEMS sensor as claimed in claim 14, further comprising a step of forming a plurality of trenches by etching the top surface of the single-crystal silicon wafer between the steps b) and c).

16. The method for manufacturing the MEMS sensor as claimed in claim 15, wherein the step c) comprises infusing a kind of alkaline liquor into the trenches to etch the single-crystal silicon wafer in order to form the chamber which is in communication with the trenches.

17. The method for manufacturing the MEMS sensor as claimed in claim 14, wherein the medium layer is made of silicon oxide or silicon nitride, and in the step f), the sacrificial layer is removed by Buffered Oxide Etchant (BOE) or a reactive ion etching process.

18. The method for manufacturing the MEMS sensor as claimed in claim 14, wherein, in the step f), the passivation layer is formed by a Low Pressure Chemical Vapor Deposition (LPCVD) process or a Plasma Enhanced Chemical Vapor Deposition (PEVCD) process, and the passivation layer is made of silicon oxide or silicon nitride.

19. The method for manufacturing the MEMS sensor as claimed in claim 14, between the steps h) and i), further comprising steps of forming diagrams both of a cantilever beam and a mass block on the passivation layer.

20. The method for manufacturing the MEMS sensor as claimed in claim 19, wherein the piezoresistance is set at the cantilever beam or at the single-crystal silicon film which is located over the cavity.

* * * * *